(12) United States Patent
Van Munster et al.

(10) Patent No.: US 9,362,157 B2
(45) Date of Patent: Jun. 7, 2016

(54) METHOD OF PROCESSING SUBSTRATE HOLDER MATERIAL AS WELL AS SUBSTRATE HOLDER PROCESSED BY SUCH METHOD

(75) Inventors: Marcus Gerardus Van Munster, Tilburg (NL); Wilhelmus Johannes Mattheus Van Velzen, Eindhoven (NL); Johannes Leonardus Lamberdina Van Der Heijden, Beek en Donk (NL)

(73) Assignee: XYCARB CERAMICS B.V., Helmond (NL)

( * ) Notice: Subject to any disclaimer, the term of this patent is extended or adjusted under 35 U.S.C. 154(b) by 1120 days.

(21) Appl. No.: 13/365,665

(22) Filed: Feb. 3, 2012

(65) Prior Publication Data

US 2012/0199063 A1    Aug. 9, 2012

Related U.S. Application Data

(60) Provisional application No. 61/439,648, filed on Feb. 4, 2011.

(30) Foreign Application Priority Data

Feb. 4, 2011    (NL) ...................................... 2006146

(51) Int. Cl.
| | | |
|---|---|---|
| *G01R 31/26* | (2014.01) | |
| *H01L 21/687* | (2006.01) | |
| *C23C 16/458* | (2006.01) | |
| *C30B 25/12* | (2006.01) | |
| *H01L 21/66* | (2006.01) | |

(52) U.S. Cl.
CPC ...... *H01L 21/68757* (2013.01); *C23C 16/4581* (2013.01); *C30B 25/12* (2013.01); *H01L 22/14* (2013.01)

(58) Field of Classification Search
None
See application file for complete search history.

(56) References Cited

U.S. PATENT DOCUMENTS

| | | |
|---|---|---|
| 3,980,854 A | 9/1976 | Berkman et al. |
| 4,047,496 A | 9/1977 | McNeilly et al. |

(Continued)

FOREIGN PATENT DOCUMENTS

| | | |
|---|---|---|
| EP | 0975011 A1 | 1/2000 |
| EP | 1298731 A1 | 4/2003 |

(Continued)

OTHER PUBLICATIONS

Machine English translation of Japanese Patent Application Publication 2010177610 A, with Soichiro Matsuura, Aug. 12, 2012. Translation of pp. 1-10 created on Jun. 20, 2015.*

(Continued)

*Primary Examiner* — Benjamin M Baldridge
(74) *Attorney, Agent, or Firm* — Haynes and Boone, LLP

(57) ABSTRACT

A method is provided of processing substrate holder material for a substrate holder on which on a first side of said substrate holder a semiconductor substrate is to be placed for layered deposition of various semiconductor materials on the semiconductor substrate using induction heating. The method includes the operations of determining a first electrical resistivity at at least one measuring position on said substrate holder material, comparing said first electrical resistivity with a second reference electrical resistivity and adapting said substrate holder material in correspondence with said comparison. Also a substrate holder is provided which is processes by such a method.

17 Claims, 3 Drawing Sheets

(56) References Cited

U.S. PATENT DOCUMENTS

| | | | |
|---|---|---|---|
| 7,067,178 B2* | 6/2006 | Muto et al. | 427/448 |
| 2003/0016727 A1* | 1/2003 | Jones et al. | G01K 11/24 374/117 |
| 2004/0138838 A1* | 7/2004 | Scheiner et al. | 702/64 |
| 2004/0187790 A1* | 9/2004 | Bader et al. | C23C 16/4581 118/728 |
| 2009/0034149 A1* | 2/2009 | Lubomirsky et al. | 361/234 |
| 2009/0152259 A1 | 6/2009 | Fan et al. | |
| 2010/0088872 A1* | 4/2010 | Shih | 29/402.01 |
| 2011/0114017 A1* | 5/2011 | Kimura et al. | 117/108 |

FOREIGN PATENT DOCUMENTS

| | | |
|---|---|---|
| EP | 2023394 A1 | 2/2009 |
| JP | 2010177610 A * | 8/2010 |
| WO | 03/069029 A1 | 8/2003 |
| WO | 2009/041578 A1 | 4/2009 |

OTHER PUBLICATIONS

International Search Report and the Written Opinion mailed Oct. 6, 2011, in counterpart Dutch Patent Application No. 2006146.

* cited by examiner

METHOD OF PROCESSING SUBSTRATE HOLDER MATERIAL AS WELL AS SUBSTRATE HOLDER PROCESSED BY SUCH METHOD

CROSS REFERENCE TO RELATED APPLICATIONS

The present application claims priority of the Netherlands patent application no. 2006146 filed Feb. 4, 2011, incorporated herein by reference. The present application also claims priority of U.S. provisional patent application No. 61/439,648 filed Feb. 4, 2011, incorporated herein by reference.

TECHNICAL FIELD

The present invention relates to a method of processing substrate holder material for a substrate holder on which on a first side of said substrate holder a semiconductor substrate is to be placed for layered deposition of various semiconductor materials on the semiconductor substrate using induction heating.

The present invention also relates to a substrate holder processes by such a method.

BACKGROUND

For manufacturing semiconductor devices, such as integrated circuits and light emitting diodes, LEDs, it has long been a practice to employ chemical vapor deposition, CVD, as well as epitaxial processes for depositing various materials on substrates at high temperatures as part of the process of making these semiconductor devices. At these high temperatures a substrate holder such as a susceptor is used for supporting the substrate or substrates upon which the material is to be deposited by the well known processes of CVD and epitaxy. These susceptors are often heated by induction, by making use of the susceptance of the substrate holder material there made of, which is often graphite.

The susceptors used for these and other semiconductor manufacturing processes are know, for example from U.S. Pat. No. 3,980,854 and U.S. Pat. No. 4,047,496.

Examples of semiconductor production processes wherein susceptors are used are diffusion and oxidation processes and CVD processes for depositing polysilicon and dielectric layers, such as SiO2, Si3N4, SiOxNy and conductive layers such as WSix, TiN, TaN en TaO. Metalorganic Chemical Vapour Deposition, MOCVD, is another semiconductor production process wherein susceptors are used. Because, amongst others, the technique of MOCVD is preferred for the formation of devices incorporating thermodynamically metastable alloys, it has become a major process in the manufacturing of for example LEDs and solar cells.

As well as in MOCVD as in epitaxial processes substrates are supported by wafer carriers or susceptors (also called substrate holders). These supports are often heated by induction. When using induction the susceptance of the base material of the susceptor, which is often graphite, is used for heating the substrate by thermal contact with and/or radiation from the heated susceptor.

Most of the substrate holders used today are used in either vertical or horizontal systems wherein the substrate holders of the vertical type are known as a barrel type susceptor. In either case, there are susceptors which are configured to support (or hold) a multiplicity of smaller substrates, for simultaneously depositing materials on the multiplicity of substrates. For this type of simultaneously depositing of materials it is, like single substrate holders, difficult to produce semiconductor devices with a high and stable quality standard.

There are a number of technical difficulties in the process of manufacturing high quality semiconductor devices and especially in the process of MOCVD and in Epitaxial processes. A major factor of quality lies in stable process parameters. With an increasing demand for high quality semiconductor devices with low tolerance levels and an increasing demand for a high yield on the production process more stable process parameters are needed.

A major factor in unstable process parameters is the control of temperature which is critical at the elevated temperatures needed for proper deposition. It is difficult to control these temperatures within the critical tolerances at all the desired locations within the reaction chambers. It is know that due to the susceptor and the heater configuration, such as, an induction coil, various positions of the susceptor may adopt different temperatures. The wafer temperature is influenced by the contact area with the susceptor and distance to the susceptor. The temperature differences result in different deposition layer thicknesses, or in the case of MOCVD also in layer composition, from one substrate to another, and even in non uniform individual substrates. As a result of these different thicknesses a quality drop of the end products will occur and production yield will drop.

To a certain amount the temperature differences can be compensated by a difference in the design and shape of the susceptors. Most susceptors for example are provided with a recess for the placement of the substrate. At this recess the susceptor is of a different thickness, resulting in unwanted temperature fluctuations. It is known, for example from WO 2003 069029 A1 to provide indentations in susceptors to overcome and compensate for these temperature differences as a result of the different thicknesses. These general design rules however are only unique for a certain type of susceptor in a specific inductive reactor system.

Temperature differences within the susceptor however do not only occur as a result of non uniform thicknesses. Contamination by deposition of non-susceptance material on the susceptor and/or substrate, which may be occur during loading and unloading, lead to deficiency and therefore unwanted temperature differences. Furthermore the inhomogene properties of the base material, mostly graphite, of the susceptor also lead to temperature differences.

To compensate for these temperature differences it is commonly known to rotate the susceptor in the induction field, thereby, partially, compensating the differences in the induction field. Temperature differences in the susceptor due to the inhomogeneity of the base material and non uniformity of the thickness of individual susceptors are not compensated. It is also commonly known to rotate the wafers with respect to the susceptor by use of a small substrate holder, often referred to as a planetenscheibe. The small substrate holder is placed in the recesses of the susceptor and rotates apart from the susceptor. On this small substrate holder the wafer is deposited. Because of the second rotation of the small substrate holder a further compensation of the temperature differences is obtained. These small compensations however do not result in optimal temperature uniformity and therefore non-uniform deposition of the deposition materials of the wafer still exists.

With the increasing demand for high quality manufactured semiconductor devices and an increasing demand for a high production yield the need for improved temperature control increases.

SUMMARY OF THE INVENTION

It is an object of the present invention to provide a method for processing substrate holder material for a substrate holder for increasing the temperature uniformity of the substrate holder material.

It is another object of the present invention to provide a substrate with increased temperature uniformity.

The aforementioned objects are achieved with a method of processing substrate holder material comprising determining a first electrical resistivity at at least one measuring position on the substrate holder material, comparing the first electrical resistivity with a second reference electrical resistivity, adapting the substrate holder material in correspondence with the comparison.

An advantage of the method according to a first aspect of the present invention is that the temperature uniformity of the substrate holder is increased, thereby reducing the unstable process parameters, resulting in substrates with more uniform deposition layer thicknesses or compositions in individual substrates and from one substrate to another. Because local differences in electrical resistivity are determined these differences can be reduced by locally modifying or adapting the substrate holder. This results in a more uniform electrical resistivity profile of the substrate holder which will results in a more uniform current induction and hence heat generated by the substrate holder material. Substrates of high quality and uniform deposition layer thicknesses can be manufactured with this method.

In prior art methods only theoretical knowledge is used to adapt the manufacturing process of substrate holders from substrate holder material. In practice the theoretical knowledge does often not match with the real parameters of the substrate holder during the manufacturing process. Substrate holder material in a bulk has a certain amount of contamination, inhomogeneity and non-uniformity. They all lead to differences in the temperatures at positions in the horizontal plane of the substrate holder. A substrate or wafer to be produced on, carried by, the substrate holder will suffer from a non uniform temperature profile. The method according to a first aspect of the present invention minimises these temperature differences in the horizontal plane by adapting the substrate holder material in accordance with a comparison of a measured parameter of the substrate holder material with a reference parameter or parameters, which parameter comprises an electrical resistivity.

In a further aspect the first electrical resistivity comprises a first set of electrical resistivity values determined at at least two measuring positions on the substrate holder material, wherein the second reference electrical resistivity is determined from the first set of electrical resistivity values. The first set of electrical resistivity values is compared with the second reference electrical resistivity and the substrate holder material is adapted in correspondence with this comparison.

The operations of measuring and adapting can be performed on different levels of the production process. For example, when the substrate holder material is provided in a bulk form, often large bulk cylinders of substrate holder material are provided. The first electrical resistivity, or first set electrical resistivity values can be determined from the bulk of substrate holder material, but also from a slice of the bulk, or from an individual substrate holder manufactured from that slice. From this value, or these values, a reference electrical resistivity can be determined. Subsequently this reference electrical resistivity, the second electrical resistivity, can be used for the comparison. This operation of comparing and adapting can be performed either at the same level or at a different level, i.e. bulk, slice or individual substrate holder.

For example, a set of electrical resistivity values can be measured from a slice of substrate holder material. From the set of values a reference value can then be determined. In an aspect this can be the highest value or lowest value of electrical resistance or electrical resistivity. In a practical aspect this is the value towards which the other values can be corrected, e.g. the lowest values can be adapted to approach the single highest value of the set. Subsequently this slice of substrate holder material is adapted in correspondence with the difference between the determined electrical resistivity values and the reference electrical resistivity.

However, the operation of adapting can also be performed on a single substrate holder manufactured from the slice. And in another aspect a set of electrical resistivity values can be measured from a bulk of substrate holder material. Then a reference electrical resistivity can be determined from that set of measurements, which reference can be used in a comparison with measured electrical resistivity values at measuring positions on a slice of substrate holder material from that same bulk or from the substrate holder manufactured from that slice of that same bulk.

In this way contamination, inhomogeneity and non-uniformity of the material in the bulk, slice or substrate holder is mapped. From this mapping a reference value can be determined. The reference value is determined in such a way that the bulk, slice or substrate holder can be adapted in such a way that the individual measured values of the first set of electrical resistivity approach the reference value. In a practical aspect of the invention the substrate holder bulk, slice or individual substrate holder is adapted at those positions where the measured electrical resistivity values differ from the reference electrical resistivity. Herewith errors due to contamination, inhomogeneity and non-uniformity of the material are reduced and a more uniform temperature profile is achieved.

In further aspect the first electrical resistivity and/or the second electrical resistivity is determined by measuring physical properties of the substrate holder material comprising at least one of a group of thermal conductivity, Youngs modulus, flexural strength, thickness, magnetic permeability, electrical conductivity, electrical resistance.

There are several methods for determining the electrical resistivity of the substrate holder material. These methods are in a way indirect measuring methods for the electrical resistivity. In combination with known correlations between these indirect measurement methods and the electrical resistivity they can be used for determining the electrical resistivity of the substrate holder material. The group of indirect measuring methods is however not restricted solely to the above mentioned methods. Several other characteristics of the substrate holder material can be measures which can also provide indirect information for determining the electrical resistivity of the substrate holder material.

In another aspect there is provided a method wherein the substrate holder material comprises a bulk of substrate holder material for manufacturing several substrate holders out of the bulk.

The first operation in the production process of substrate holders is providing a large bulk, mostly having a cylinder shape, of substrate holder material. This bulk contains high purity substrate holder material and during the production of this bulk homogeneity of the base material, often graphite, is pursued. The substrate holder material of this bulk however isn't always that homogyne as desired. During the second operation in the production process out of the bulk cylinder a certain amount of slices are formed. These slices of substrate holder material are then used to form a single substrate holder out of it, but before such a single substrate holder is finished often different finalizing operations are performed like providing a recess in the substrate holder in which a substrate or small satellite disk is to be placed, or applying a coating layer on the substrate holder. In some cases the production process is characterized by an additional operation performed between the first and second operations and during which the bulk cylinder is firstly split into several smaller cylinders of substrate holder material. Then these smaller cylinders are used to form several slices out it.

By determining the electrical resistivity at measuring positions of the substrate holder material of the bulk cylinder, an indication can be given of the uniformity, or non-uniformity, of the bulk substrate holder material. The electrical resistivity of the various positions can be compared with a reference electrical resistivity thereby determining local differences. The knowledge gained by measuring this bulk cylinder can be used during different stages of the production process. The slices of substrate holder material which are formed out of the bulk cylinder can for example be process by modifying its substrate holder material in correspondence with the measurement results gained during measuring of the bulk cylinder. The measurement results of the bulk cylinder can for example disclose deviations from the average electrical resistivity in a certain segment of the bulk cylinder or at a certain depth. Each slice of substrate holder material can then be modified in correspondence with these deviations. Instead of using the gained measurement results for modifying the slice of substrate holder material it is also possible to modify the final product, being the finalized substrate holder.

In yet another aspect there is provided a method wherein the substrate holder material comprises a slice of substrate holder material for manufacturing a substrate holder out of the slice.

The operations of determining, comparing and adapting can, in a different aspect of the invention also be applied on slices of substrate holder material. In the process of manufacturing the substrate holders the slices formed out of the bulk cylinder can also be measured. The knowledge gained by the measurements is restricted to and therefor especially suited for that individual slice. The advantage thereof is that modifications can be made in correspondence with measurements results of that single slice and are therefor more effective, resulting in an even more increased electrical resistivity uniformity of the substrate holder. The measurement results gained by measuring the slice of substrate holder material can be used to modify that slice or the modify the finalized substrate holder formed out of that slice. In both cases the measurement results are especially suited for that individual slice.

Instead of using the measurement results gained by measuring the slice of substrate holder material, or like in the previous aspect of the invention, by measuring the bulk cylinder, measuring the smaller cylinder formed out of the bulk of which several slices can be formed is also possible. These measurement results can than be used to adapt the single slices of substrate holder material or to adapt the finalized product, the substrate holder. The measurement results of the smaller cylinder are more accurate than the results gained from the measurement of the bulk cylinder, however they are not that accurate as the results gained from measuring the single slices. On the other hand, measuring each single sliced takes more time. Depending on demanded quality level of the finalized products and available time for production an appropriate operation in the production process can be picked for measurement and modification.

In yet another aspect there is provided a method wherein the substrate holder material comprises a substrate holder.

At the end of the production process the substrate holder is final and is not further processed, therefor modifications based on these measurements are very accurate. Substrate holders with a very high temperature uniformity can be achieved with this method of processing.

In another aspect there is provided a method wherein the operation of adapting the substrate holder material comprises machining the substrate holder thereby adapting at least partly the thickness of the substrate holder material near the at least one measuring position (or at a different position on the substrate holder) in correspondence with the comparison of electrical resistivity. This includes the partial removal of substrate holder material, e.g. by varying the thickness locally, by drilling holes, grooves, a recess, an indentation or the like in the substrate holder surface A way of modifying the local electrical resistivity is to adapt the thickness of the substrate holder material near that local measuring position. Reducing the thickness will result in higher electrical resistivity and therefor higher local heat induction. Adapting the thickness can be applied on the top side of the substrate holder, being the side on which the substrate is to be placed, or on the bottom side, being the side where induction heating takes place. Adapting the thickness on both sides of the substrate holder is also possible.

In an other aspect a method is provided wherein prior to the operation of adapting the substrate holder, a resistivity profile of the substrate holder material is generated, wherein the resistivity profile is based on the comparison of electrical resistivity of at least a few measuring positions of the substrate holder material, and wherein the substrate holder material is being modified in correspondence with the resistivity profile.

A sequence of the electrical resistivity of various measurement positions on the substrate holder material can form a resistivity profile. This profile can for example be presented in a graph-form or in a two dimensional representation of the substrate holder wherein colour differences indicate resistivity deviations. An advantage of the use of these profiles is that graphical representations of measurement results make interpretation easier.

In yet another aspect a method is provided wherein prior to the operation of adapting the substrate holder, a reference point is defined on the substrate holder material, and wherein the at least one measuring position is defined with respect to the reference point.

Determining whether the modification position is in correspondence with a measurement position is easier with the use of a reference point. Measurements and modifications can then be made with respect to this reference point. Another advantage of the use of reference points is not only the precise position determination but the operations of measuring and modifying can also be performed separately. A first device is used for measuring resistivity of the substrate holder at certain positions with respect to the reference point. The substrate holder can then be placed, even in a different orientation, in another device. There the correct modification positions can be derived from the reference point.

In a further aspect a method is provided wherein the operation of adapting the substrate holder comprises the operation of reducing the porosity of the substrate holder material, in particular, reducing the porosity by injecting a curable resin, in correspondence with the comparison of electrical resistivity.

In even another aspect a method is provided wherein the operation of determining comprises subsequent measuring at multiple measuring positions on the substrate holder material or comprises simultaneously measuring at multiple measuring positions on the substrate holder material.

In yet another aspect a method is provided, wherein during the operation of determining an in the substrate holder material generated eddy current is measured. In a further aspect also a variable-frequency generated eddy current can be used.

In yet another aspect a method is provided wherein the operations of determining, comparing and adapting are iterative operations.

The operations of determining, comparing and adapting can not only be performed during different stages of the production process, these operations can also be repeated until a certain desired resistivity uniformity is reached and a certain quality level can be assured. These operations can be performed repeatedly, for example by measuring the electrical resistivity of the substrate holder and adapting the substrate holder on the basis of these measurements results. These operations can also be performed recursively, meaning that for example the measurement operation can be performed at different stages, first at level of the bulk cylinder of substrate holder material and further during the process at the level of the slice of substrate holder material and during the level of the finalized product. After al these measurement operations, the operation of adapting can be applied.

In an other aspect a substrate holder for epitaxial growth reactors or metalorganic vapour phase epitaxy, MOCVD, of the type to be heated is provided, wherein the substrate holder is processed in accordance with the method according to any one of the preceding claims.

DETAILED DESCRIPTION OF THE DRAWINGS

Figure 1:
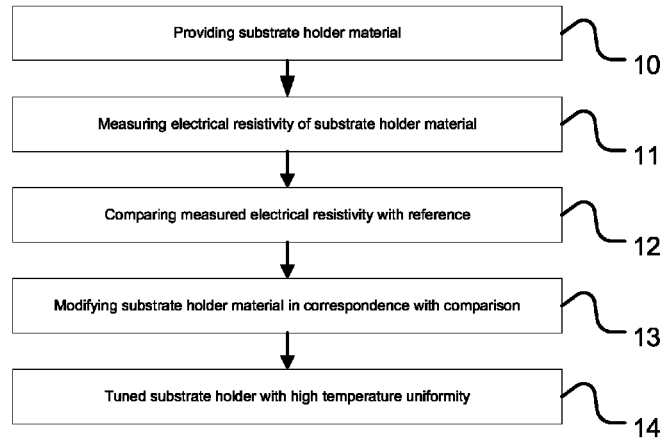
FIG. 1 illustrate the operations of the first aspect of the present invention.

FIG. 1 shows the operations of the method according to the first aspect of the invention. Substrate holder material is usually provided in high purity form. The substrate holder material isn't as homogene as desired which is, amongst others, one of the reasons the substrate holders comprising the substrate holder material have a non optimal temperature uniformity. By performing the operations shown in FIG. 1 the temperature uniformity of the substrate holder can be substantially increased by subsequently "Providing substrate holder material" 10, "Measuring electrical resistivity of the substrate holder material" 11, "Comparing the measured electrical resistivity of the substrate holder material with a reference" 12, "Modifying substrate holder material in correspondence with the comparison" 13, which finally results in a "Tuned substrate holder with high temperature uniformity" 14.

The operation of Measuring 11 is for example performed by an eddy current measurement. Eddy current measurement uses electromagnetic induction and can be used to detect flaws in the conductance of materials. Depending on frequency used with the eddy current measurement different depths can be reached. The lower the frequency the deeper the current is induced in the material. The way of testing electrical resistivity with such an eddy current measurement is very similar to the way the substrate holders are heated in inductive heating system.

Not only the electrical resistivity of the substrate holder material can be tested with an eddy current measurement. It is, amongst others, also possible to test for cracks in the surface of the substrate holder material or to test the thickness of the coating on the substrate holder itself. Relative small defects, cracks in the surface and temperature defects caused by non-uniformity of the substrate holder base material can be detected by such eddy current measurements.

Besides using eddy current measurements other types of tests can be used to determine the electrical resistivity of the substrate holder material. Non-destructive testing methods, like eddy current testing, are preferred. Test methods like remote field testing or alternating current field measurements can also be used for the operation 11 of measuring the electrical resistivity of the substrate holder material.

The electrical resistivity is measured at several positions on the substrate holder material. The more positions measured the more information about the electrical resistivity is gained. This information is used during the next operation of the method 12 "Comparing measured electrical resistivity with reference". In this operation 12 the electrical resistivity of the at least one measurement position on the substrate holder material is compared with a reference electrical resistivity. This reference electrical resistivity can be an average of the electrical resistivity of the measured substrate holder material or an industry reference, for example determined by the average of a large amount of measurements.

When the difference between the measured electrical resistivity of operation 11 and the reference electrical resistivity of operation 12 is determined this difference can be used to modify the substrate holder material during the next operation of the method being operation 13 "Modifying substrate holder material in correspondence with comparison". Wherever the electrical resistivity of the substrate holder material is exceeding the specifications, for example a maximum electrical resistivity variation resulting in a temperature difference of 2° C. over the surface of the substrate holder, the substrate holder material can be modified to reduce those variations. A more uniform electrical resistivity of substrate holder material is achieved and the substrate holder will have a high temperature uniformity as shown in the final operation 25 of the method "Tuned substrate holder with high temperature uniformity".

Figure 2:
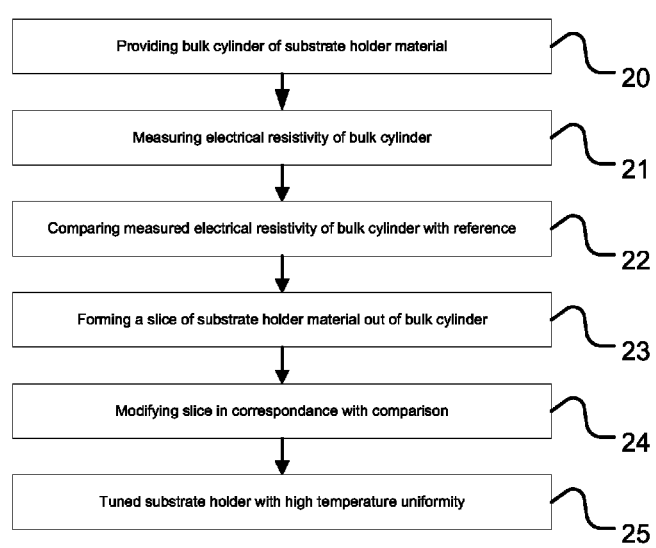
FIGS. 2, 3 and 4 illustrate further aspects of the method according to the invention.

FIG. 2 discloses another aspect of the invention wherein in the first operation 20 of the method "Providing a bulk cylinder of substrate holder material" a bulk of substrate holder material is provided which is mostly in a cylinder shape and containing enough substrate holder material to form several substrate holders out of it. The method can not only be preformed on cylinder shaped bulk substrate holder materials but also on other shapes and forms. For example for barrel type substrate holders.

In the second operation 21 of the method "Measuring electrical resistivity of the bulk cylinder" the electrical resistivity of the bulk cylinder is measured. The more measurements positions the more information and the more precise the deviation in temperature uniformity (temperature non-uniformity) of the bulk can be determined in the next operation 22 of the method "Comparing measured electrical resistivity of bulk cylinder with reference". Flaws of the base material, which often is graphite, can be determined during this operation 22. These flaws or defects can be disclosed in certain regions of the bulk material or in certain segments. Information where the defects appear depend on the method of measurement used in operation 21. For example when using an eddy current testing the frequency determines the depth of measurement.

In the next operation 23 "Forming a slice of substrate holder material out of bulk" a slice of substrate holder material is cut or sawn out of the bulk cylinder. The cylinder usually holds enough substrate holder material to form several slices out of it. Defected segments disclosed in operation 22 can be modified in operation 24 "Modifying slice in correspondence with comparison". The end result of the process is operation 25 a "Tuned substrate holder with high temperature uniformity".

Figure 3:
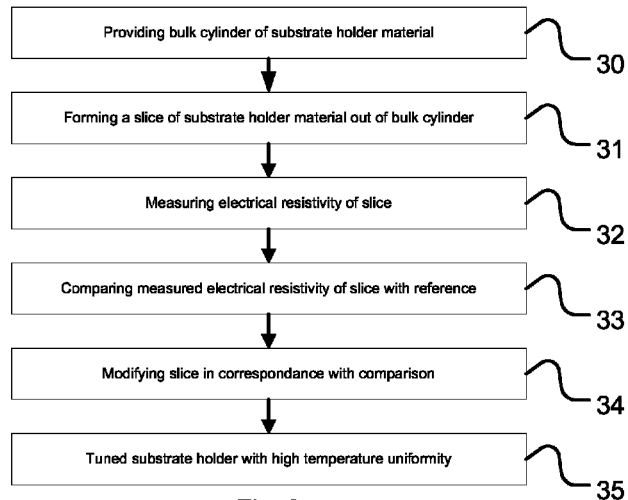

In FIG. 3 a method according to the invention is disclosed wherein the operation of measuring is performed at a different stage. After operation 30 "Providing a bulk cylinder of substrate holder material" in operation 31 "Forming a slice of substrate holder material out of bulk cylinder" a slice is formed before the actual measurements on the substrate holder material take place in operation 32 "Measuring electrical resistivity of slice". The result of the measurements is dedicated information for that specific slice. Of course operations 31 and 32 can be repeated until several slices are obtained from the bulk cylinder of operation 30. The dedicated measurement results are in operation 33 "Comparing measured electrical resistivity of slice with reference" compared with a reference electrical resistivity. The differences are compensated by the next operation 34 of "Modifying slice in correspondence with comparison", resulting in a "Tuned substrate holder with high temperature uniformity" shown in the final operation 35 of the method.

Figure 4:
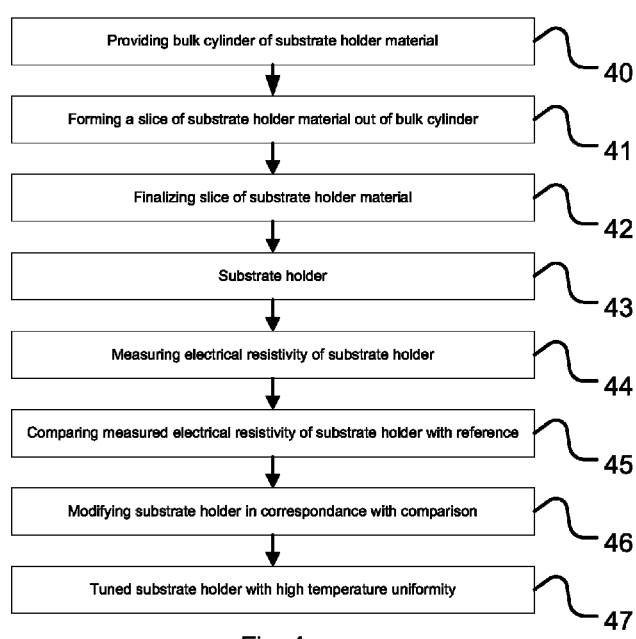

FIG. 4 shows operations of the method according to the present invention wherein the substrate holder is formed before it is measured. Measuring is performed at the stage of the final product, the substrate holder. Performing the method according to the invention is in this way the most accurate and time consuming as every substrate holder is measured 44, its measurement results are compared 45, and modified 46. The product, being the tuned substrate holder with high temperature uniformity is final at operation 47 of the method.

The operation disclosed in FIGS. 1 to 4 can also be performed repeatedly. For example by modifying the substrate holder material and then again measuring the electrical resistivity, comparing it and modifying it again, these operations can be repeated until a certain level of uniformity is achieved and a certain quality level of the substrate is guaranteed. Combinations of repeating operations at different stages of the production process are also part of the invention. One could for example perform a series of measurements on the bulk cylinder of raw substrate holder material and use this information to perform coarse modifications on the slices formed out of the bulk cylinder. These slices are then in a further stage of the production process again measured and this dedicated information is again used to modify in a fine tune way the substrate holder during a further operation of the process. This way the operations of the method are iterative operations.

Figure 5:
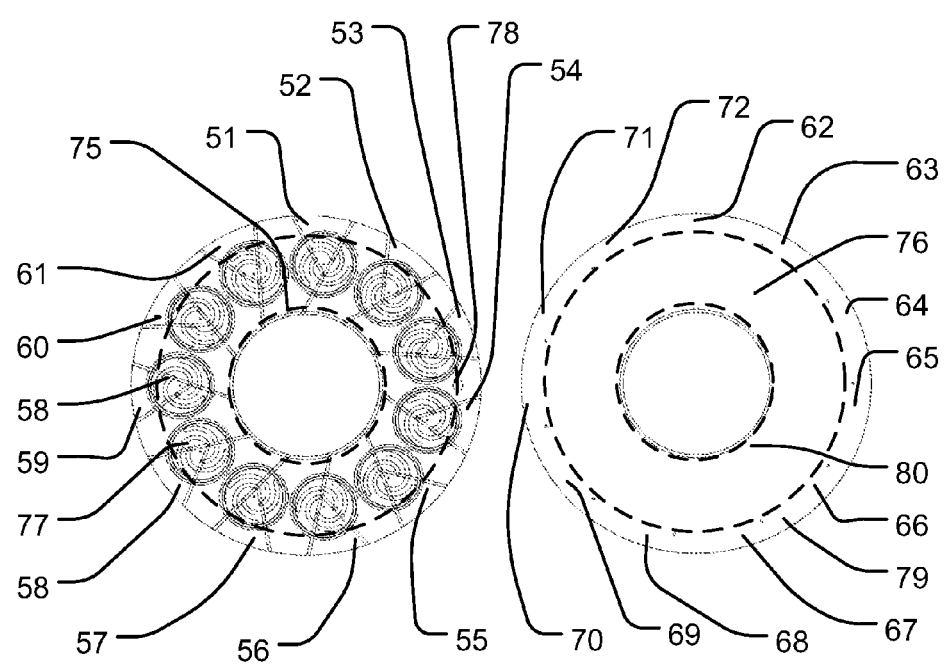
FIG. 5 illustrates a substrate holder for performing the method according to the invention.

FIG. 5 shows an example of a substrate holder suitable for the method according to the invention. This substrate holder is for example measured at at least 11 positions 51, 52, 53, 54, 55, 56, 57, 58, 59, 60 and 61 being the positions on the outer part of the substrate holder. The same positions can be measured on the back side of the substrate holder at the positions 62, 63, 64, 65, 66, 67, 68, 68, 69, 70, 71 and 72 which are all located on the outer part 79 of the substrate holder. The information on the electrical resistivity at the eleven positions on outer part of the front and back side of the substrate holder can be combined with information on the electrical resistivity of eleven positions on the inside part of the front 75 and back side 80 of the substrate holder. This way a large amount of data is collected giving precise information on the defects in uniformity of the electrical resistivity of the substrate holder. FIG. 5 also discloses a reference point 78 for determining the measurement positions with respect to this reference point 78.

During the adapting operation of the method according to the invention several ways of adapting the upper, lower or both surface(s) of the substrate holder material can be applied. These comprise for example known machining or milling techniques like drilling holes, recesses, grooves, indentations, combinations thereof and the like.

Some embodiments of the invention are as described in the following numbered clauses:

Clause 1. A method of processing substrate holder material for a substrate holder on which on a first side of said substrate holder a semiconductor substrate is to be placed for layered deposition of various semiconductor materials on the semiconductor substrate using induction heating, the method comprising the operations of:
determining a first electrical resistivity at at least one measuring position on said substrate holder material;
comparing said first electrical resistivity with a second reference electrical resistivity;
adapting substrate holder material in correspondence with said comparison.

Clause 2. The method according to clause 1, wherein said first electrical resistivity comprises a first set of electrical resistivity values determined at at least two measuring positions on said substrate holder material, wherein said second reference electrical resistivity is determined from said first set of electrical resistivity values; and wherein said first set of electrical resistivity values is compared with said second reference electrical resistivity and said substrate holder material is adapting in correspondence with said comparison.

Clause 3. The method according to clause 1 or 2, wherein said substrate holder material being adapted comprises one of the group a bulk of substrate holder material, a slice of said bulk of substrate holder material and a substrate holder.

Clause 4. The method according to clause 1, 2 or 3, wherein said second reference electrical resistivity is determined from substrate holder material comprises one of the group a bulk of substrate holder material, slice of said bulk of substrate holder material and a substrate holder.

Clause 5. The method according to any of the previous clauses, wherein at least one of said first electrical resistivity and said second electrical resistivity is determined by measuring physical properties of said substrate holder material comprising at least one of a group of thermal conductivity, Youngs modulus, flexural strength, thickness, magnetic permeability, electrical conductivity, electrical resistance.

Clause 6. The method according to any one of the preceding clauses, wherein said operation of adapting said substrate holder comprises machining said substrate holder thereby adapting at least partly the thickness of said substrate holder in correspondence with said comparison of electrical resistivity.

Clause 7. The method according to any one of the preceding clauses, wherein prior to said operation of adapting said substrate holder, a resistivity profile of said substrate holder material is generated, wherein said resistivity profile is based on said comparison of electrical resistivity of at least a few measuring positions of said substrate holder material, and wherein said substrate holder is being adapted in correspondence with said resistivity profile.

Clause 8. The method according to any one of the preceding clauses, wherein prior to said operation of adapting said substrate holder, a reference point is defined on said substrate holder material, and wherein said at least one measuring position is defined with respect to said reference point.

Clause 9. The method according to any one of the preceding clauses, wherein the operation of adapting said substrate holder comprises the operation of reducing the porosity of said substrate holder in correspondence with said comparison of electrical resistivity.

Clause 10. The method according to clause 9, wherein the operation of reducing the porosity of said substrate holder comprises injecting a curable resin in correspondence with said comparison of electrical resistivity.

Clause 11. The method according to any one of the preceding clauses, wherein the operation of determining said first electrical resistivity comprises subsequent or simultaneously measuring at multiple measuring positions on said substrate holder material.

Clause 12. The method according to any one of the preceding clauses, wherein during said operation of determining said first electrical resistivity an in said substrate holder material generated eddy current, and in particular a variable-frequency eddy current, is measured.

Clause 13. The method according to clause 12, wherein said eddy current comprises a variable-frequency eddy current.

Clause 14. The method according to any one of the preceding clauses, wherein said operations of determining, comparing and adapting are iterative operations.

Clause 15. A substrate holder for epitaxial growth reactors or metalorganic vapour phase epitaxy, MOCVD, of the type to be heated, wherein the substrate holder is processed in accordance with the method according to any one of the preceding claims.

The invention claimed is:

1. A method of processing substrate holder material to reduce temperature differences in a substrate holder's horizontal plane when a semiconductor substrate is placed on the substrate holder for deposition of materials on the semiconductor substrate using induction heating of the substrate holder, the method comprising the operations of:
   determining a set of electrical resistivity values at at least two measuring positions on said substrate holder material;
   comparing said set of electrical resistivity values with a reference electrical resistivity, wherein said reference electrical resistivity is determined from the set of electrical resistivity values;
   locally adapting said substrate holder material at at least one position thereof, wherein said locally adapting is performed in correspondence with said comparison to reduce the temperature differences in the substrate holder's horizontal plane in said deposition of materials.

2. The method according to claim 1, wherein said locally adapting said substrate holder material comprises locally adapting a bulk of substrate holder material, a slice of said bulk of substrate holder material or a substrate holder.

3. The method according to claim 1, wherein said reference electrical resistivity is determined from a bulk of substrate holder material, a slice of said bulk of substrate holder material or a substrate holder.

4. The method according to claim 2, wherein said reference electrical resistivity is determined from the bulk of substrate holder material, the slice of said bulk of substrate holder material or the substrate holder.

5. The method according to claim 1, wherein at least one of said electrical resistivity values and said reference electrical resistivity is determined by measuring one or more physical properties of said substrate holder material, the one or more physical properties comprising at least one of thermal conductivity, Young's modulus, flexural strength, thickness, magnetic permeability, electrical conductivity, and electrical resistance.

6. The method according to claim 4, wherein at least one of said electrical resistivity values and said reference electrical resistivity is determined by measuring one or more physical properties of said substrate holder material, the one or more physical properties comprising at least one of thermal conductivity, Young's modulus, flexural strength, thickness, magnetic permeability, electrical conductivity, and electrical resistance.

7. The method according to claim 2, wherein at least one of said electrical resistivity values and said reference electrical resistivity is determined by measuring one or more physical properties of said substrate holder material, the one or more physical properties comprising at least one of thermal conductivity, Young's modulus, flexural strength, thickness, magnetic permeability, electrical conductivity, and electrical resistance.

8. The method according to claim 1, wherein said operation of adapting said substrate holder material comprises machining said substrate holder thereby adapting at least partly the thickness of said substrate holder in correspondence with said comparison of electrical resistivity.

9. The method according to claim 1, wherein prior to said operation of adapting said substrate holder material, a resistivity profile of said substrate holder material is generated, wherein said resistivity profile is based on said comparison of electrical resistivity of at least two measuring positions of said substrate holder material, and wherein said substrate holder is adapted in correspondence with said resistivity profile.

10. The method according to claim 1, wherein prior to said operation of adapting said substrate holder material, a reference point is defined on said substrate holder material, and wherein at least one of said measuring positions is defined with respect to said reference point.

11. The method according to claim 1, wherein the operation of adapting said substrate holder comprises the operation of reducing the porosity of said substrate holder in correspondence with said comparison of electrical resistivity.

12. The method according to claim 11, wherein the operation of reducing the porosity of said substrate holder comprises injecting a curable resin in correspondence with said comparison of electrical resistivity.

13. The method according to claim 1, wherein the operation of determining said set of electrical resistivity values comprises consecutively or simultaneously measuring at multiple measuring positions on said substrate holder material.

14. The method according to claim 1, wherein during said operation of determining said set of electrical resistivity values, an eddy current is generated in said substrate holder material.

15. The method according to claim 14, wherein said eddy current comprises a variable-frequency eddy current.

16. The method according to claim 1, wherein said operations of determining, comparing and adapting are iterative operations.

17. A substrate holder for epitaxial growth reactors or metalorganic vapour phase epitaxy, MOCVD, of the type to be heated, wherein the substrate holder has been processed in accordance with the method according to claim 1.

* * * * *